United States Patent
Guo

(10) Patent No.: US 10,180,743 B2
(45) Date of Patent: Jan. 15, 2019

(54) LIQUID CRYSTAL DISPLAY PANEL, LIQUID CRYSTAL DISPLAY APPARATUS, AND CONTROLLING METHOD THEREOF

(71) Applicants: BOE TECHNOLOGY GROUP CO., LTD., Beijing (CN); HEFEI BOE OPTOELECTRONICS TECHNOLOGY CO., LTD., Hefei (CN)

(72) Inventor: Yuanhui Guo, Beijing (CN)

(73) Assignees: BOE Technology Group Co., Ltd., Beijing (CN); Hefei BOE Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 15/550,125

(22) PCT Filed: Aug. 30, 2016

(86) PCT No.: PCT/CN2016/097322
§ 371 (c)(1),
(2) Date: Aug. 10, 2017

(87) PCT Pub. No.: WO2018/039906
PCT Pub. Date: Mar. 8, 2018

(65) Prior Publication Data
US 2018/0239475 A1 Aug. 23, 2018

(51) Int. Cl.
*G06F 3/044* (2006.01)
*G06F 3/047* (2006.01)
(Continued)

(52) U.S. Cl.
CPC .......... *G06F 3/0412* (2013.01); *G02F 1/1362* (2013.01); *G02F 1/13338* (2013.01);
(Continued)

(58) Field of Classification Search
CPC ....... H01L 27/1214; H01L 2027/11879; H01L 27/124; H01L 27/1296; H01L 27/3288;
(Continued)

(56) References Cited

U.S. PATENT DOCUMENTS 6,628,355 B1 * 9/2003 Takahara ............... G02F 1/1334
348/E9.027
6,781,657 B1 * 8/2004 Kim .................. G02F 1/134363
349/129

(Continued)

FOREIGN PATENT DOCUMENTS

| CN | 1979295 A | 6/2007 |
| CN | 101071244 A | 11/2007 |
| CN | 105022184 A | 11/2015 |

OTHER PUBLICATIONS

International Search Report & Written Opinion dated Jun. 8, 2017 regarding PCT/CN2016/097322.

*Primary Examiner* — Julie Anne Watko
(74) *Attorney, Agent, or Firm* — Intellectual Valley Law, P.C.

(57) ABSTRACT

The present application discloses a liquid crystal display panel having a plurality of pixels for image display, each of which includes a subpixel region and an inter-subpixel region. The liquid crystal display panel includes an array substrate, a package substrate facing the array substrate, and a liquid crystal layer between the array substrate and the package substrate; a pixel electrode layer and a common electrode layer for applying an electric field for driving the liquid crystal layer, the pixel electrode layer including a plurality of pixel electrodes, the common electrode layer including a plurality of common electrodes; a first electrode signal line layer including a plurality of first electrode signal lines; and a plurality of circuits, each of the plurality of circuits having an output terminal electrically connected to (Continued)

a first electrode signal line of the first electrode signal line layer, an input terminal configured to receive an input voltage, and a control terminal configured to receive a control voltage; at least a portion of the first electrode signal line electrically connected to the output terminal is in the inter-subpixel region of the liquid crystal display panel. The portion of the first electrode signal line in the inter-subpixel region of the liquid crystal display panel is configured to generate an additional electric field with at least one of the common electrode, the pixel electrode, a touch electrode, and another first electrode signal line; the additional electric field is applied to the liquid crystal layer for enhancing light transmittance of the liquid crystal layer.

20 Claims, 4 Drawing Sheets

(51) Int. Cl.
G02F 1/1343 (2006.01)
G02F 1/135 (2006.01)
G02F 1/13363 (2006.01)
G02F 1/13357 (2006.01)
G02F 1/1362 (2006.01)
G09G 3/36 (2006.01)
H01L 27/12 (2006.01)
G06F 3/041 (2006.01)
G06F 3/01 (2006.01)
G02F 1/1335 (2006.01)
G02F 1/1333 (2006.01)
G02F 1/1347 (2006.01)
H01L 27/118 (2006.01)

(52) U.S. Cl.
CPC .. G02F 1/133512 (2013.01); G02F 1/133606 (2013.01); G02F 1/134309 (2013.01); G02F 1/136286 (2013.01); G06F 3/01 (2013.01); G06F 3/044 (2013.01); G06F 3/0416 (2013.01); G09G 3/36 (2013.01); G09G 3/3648 (2013.01); H01L 27/124 (2013.01); *G02F 1/13471* (2013.01); *G02F 1/136209* (2013.01); *G02F 2001/133507* (2013.01); *G02F 2201/121* (2013.01); *G02F 2201/123* (2013.01); *G09G 2354/00* (2013.01); *H01L 27/1214* (2013.01); *H01L 2027/11879* (2013.01)

(58) Field of Classification Search
CPC ............... H01L 27/1207; H01L 23/00; G02F 1/134363; G02F 1/13338; G02F 1/133512; G02F 1/134309; G02F 1/136286; G02F 2201/121; G02F 2201/123; G02F 1/1335; G02F 2001/133507; G02F 1/1336; G02F 1/133606; G02F 1/133611; G02F 1/1337; G02F 1/133707; G02F 1/1343; G02F 1/134336; G02F 1/13454; G02F 1/13471; G02F 1/136209; G02F 1/1362; G02F 1/362; G09G 3/36; G09G 3/3648; G09G 2354/00; G06F 3/0412; G06F 3/0416; G06F 3/044; G06F 3/01; G06F 3/041
See application file for complete search history.

(56) References Cited

U.S. PATENT DOCUMENTS

| | | | |
|---|---|---|---|
| 8,345,207 B2* | 1/2013 | Chung | G02F 1/134363 349/139 |
| 8,377,331 B2* | 2/2013 | Gauza | C09K 19/0275 252/299.01 |
| 2007/0126954 A1 | 6/2007 | Iijima | |
| 2007/0263143 A1* | 11/2007 | Igeta | G02F 1/133555 349/110 |
| 2009/0015768 A1* | 1/2009 | Igeta | G02F 1/133512 349/106 |
| 2010/0060813 A1* | 3/2010 | Kawashima | G02F 1/133707 349/39 |
| 2010/0091231 A1* | 4/2010 | Nishimura | G02F 1/134363 349/139 |
| 2012/0062511 A1* | 3/2012 | Ishizaki | G06F 3/0412 345/174 |
| 2013/0314452 A1* | 11/2013 | Ko | G02F 1/134336 345/690 |
| 2015/0301381 A1 | 10/2015 | Okita | |

* cited by examiner

Subpixel unit

Shade representing amplitude of illumination brightness distance across a width of a subpixel lines representing electric field distance across a width of a subpixel

LIQUID CRYSTAL DISPLAY PANEL, LIQUID CRYSTAL DISPLAY APPARATUS, AND CONTROLLING METHOD THEREOF

CROSS-REFERENCE TO RELATED APPLICATION

This application is a national stage application under 35 U.S.C. § 371 of International Application No. PCT/CN2016/097322 filed Aug. 30, 2016, the contents of which are incorporated by reference in the entirety.

TECHNICAL FIELD

The present invention relates to display technology, more particularly, to a liquid crystal display panel, a liquid crystal display apparatus, and a controlling method thereof.

BACKGROUND

A liquid crystal display (LCD) apparatus such as a smart phone or a tablet is normally operated in an image display mode for displaying an image. Typically, a flash light is installed on the backside of the LCD apparatus for temporary illumination needs, e.g., as a light source for photography. A typical display apparatus, however, does not have a flash light on the frontside of the display apparatus, limiting its use in certain applications. For example, when a user is taking a selfie picture, the display panel itself may be used as an illumination source. However, light transmittance of a typical LCD apparatus in image display mode is only about 4% on average. Thus, even when the light intensity of backlight is set to the highest intensity, the illumination provided by the display panel is insufficient as an effective light source in many circumstances.

SUMMARY

In one aspect, the present disclosure provides a liquid crystal display panel having a plurality of pixels for image display, each of which includes a subpixel region and an inter-subpixel region, the liquid crystal display panel comprising an array substrate, a package substrate facing the array substrate, and a liquid crystal layer between the array substrate and the package substrate; a pixel electrode layer and a common electrode layer for applying an electric field for driving the liquid crystal layer, the pixel electrode layer comprising a plurality of pixel electrodes, the common electrode layer comprising a plurality of common electrodes; a first electrode signal line layer comprising a plurality of first electrode signal lines; and a plurality of circuits, each of the plurality of circuits comprising an output terminal electrically connected to a first electrode signal line of the first electrode signal line layer, an input terminal configured to receive an input voltage, and a control terminal configured to receive a control voltage; at least a portion of the first electrode signal line electrically connected to the output terminal is in the inter-subpixel region of the liquid crystal display panel.

Optionally, the portion of the first electrode signal line in the inter-subpixel region of the liquid crystal display panel is configured to generate an additional electric field with at least one of the common electrode, the pixel electrode, a touch electrode, and another first electrode signal line; the additional electric field is applied to the liquid crystal layer for enhancing light transmittance of the liquid crystal layer.

Optionally, the first electrode signal line layer is a touch electrode layer comprising a plurality of touch electrodes for detecting touch; each of the plurality of circuits comprises a transistor having a drain electrode electrically connected to a touch electrode of the touch electrode layer, a source electrode configured to receive a source voltage, and a gate electrode configured to receive a gate voltage; at least a portion of the touch electrode electrically connected to the output terminal is in the inter-subpixel region of the liquid crystal display panel; and the portion of touch electrode in the inter-subpixel region of the liquid crystal display panel is configured to generate the additional electric field with at least one of the common electrode, the pixel electrode, and another touch electrode for enhancing light transmittance of the liquid crystal layer.

Optionally, the touch electrode layer is a mutual capacitive touch electrode layer comprising a plurality of first touch electrodes and a plurality of second touch electrodes, and the touch electrode connected to the drain electrode is a first touch electrode.

Optionally, the first touch electrode is a touch sensing electrode.

Optionally, the first touch electrode is a touch scanning electrode.

Optionally, the common electrode layer comprises a plurality of touch scanning electrodes operated in a time-division driving mode; the time-division driving mode comprises a display mode and a touch control mode; the plurality of touch scanning electrodes are common electrodes for applying common voltage signal during the display mode; the plurality of touch scanning electrodes are touch control electrodes for conducting touch signals during the touch control mode.

Optionally, the plurality of second touch electrodes are a plurality of touch sensing electrodes, and the first touch electrodes and the plurality of second touch electrodes are in different layers.

Optionally, the additional electric field is formed between the first touch electrode and an adjacent second touch electrode.

Optionally, the additional electric field is generated between the first touch electrode and the common electrode.

Optionally, the touch electrode layer is a self-capacitive touch electrode layer.

Optionally, the touch electrode layer is in the package substrate.

Optionally, the package substrate comprises a black matrix layer; and the touch electrode layer is on a side of the black matrix layer proximal to the array substrate.

Optionally, the package substrate comprises a passivation layer; and the touch electrode layer is on a side of the passivation layer distal to the array substrate.

Optionally, the additional electric field is formed between the touch electrode connected to the drain electrode and the common electrode layer, and the common electrode layer is in the array substrate.

Optionally, the liquid crystal display panel further comprises a controller configured to set the gate voltage to be a turn-on voltage upon receiving a control signal.

Optionally, the control signal is generated in response to a user-activated operation.

Optionally, the liquid crystal display panel further comprises a light sensor configured to detect an ambient light intensity; wherein the light sensor is configured to transmit the control signal to the controller in response to an ambient light intensity below a threshold value.

In another aspect, the present disclosure provides a liquid crystal display apparatus comprising the liquid crystal display panel described herein.

In another aspect, the present disclosure provides a method of controlling a liquid crystal display panel having a plurality of pixels for image display, each of which includes a subpixel region and an inter-subpixel region.

Optionally, the liquid crystal display panel comprising an array substrate, a package substrate facing the array substrate, and a liquid crystal layer between the array substrate and the package substrate; a pixel electrode layer and a common electrode layer for applying an electric field for driving the liquid crystal layer, the pixel electrode layer comprising a plurality of pixel electrodes, the common electrode layer comprising a plurality of common electrodes; a first electrode signal line layer comprising a plurality of first electrode signal lines; a plurality of circuits, each of the plurality of circuits comprising an output terminal electrically connected to a first electrode signal line of the first electrode signal line layer, an input terminal configured to receive an input voltage, and a control terminal configured to receive a control voltage, at least a portion of the first electrode signal line electrically connected to the output terminal is in the inter-subpixel region of the liquid crystal display panel; and a controller configured to set a gate voltage to be a turn-on voltage upon receiving a control signal.

Optionally, the method comprises transmitting a control signal to the controller; setting the gate voltage to be the turn-on voltage by the controller upon receiving the control signal, thereby allowing the input voltage to be passed from the input terminal to the output terminal and in turn to the first electrode signal line connected to the output terminal; generating an additional electric field between the portion of the first electrode signal line in the inter-subpixel region of the liquid crystal display panel and at least one of the common electrode, the pixel electrode, a touch electrode, and another first electrode signal line; and applying the additional electric field to the liquid crystal layer.

Optionally, the method further comprises generating the control signal in response to a user-activated operation.

Optionally, the liquid crystal display panel further comprises a light sensor configured to detect an ambient light intensity; the method further comprising generating the control signal by the light sensor in response to an ambient light intensity below a threshold value.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
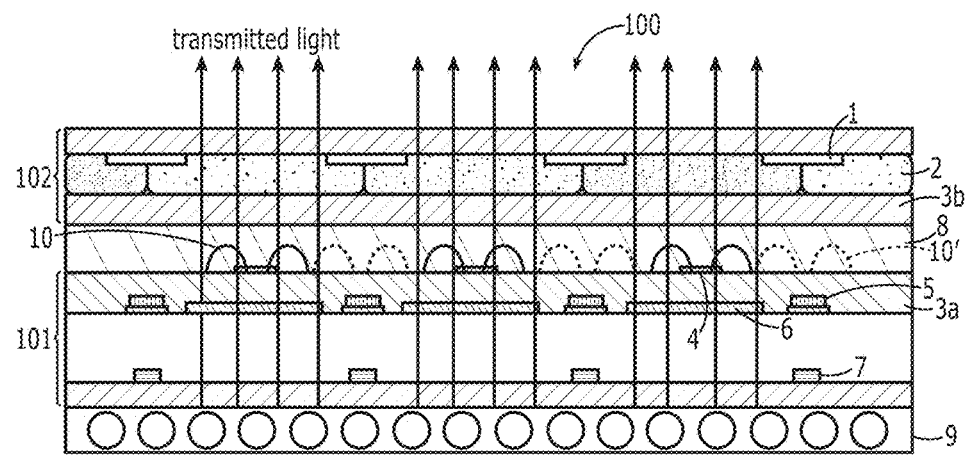
FIG. 1 is diagram illustrating the structure of a liquid crystal touch display apparatus according to some embodiments.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides a novel LCD panel, a LCD apparatus and a controlling method thereof that substantially obviate one or more of the problems due to limitations and disadvantages of the related art. In addition to an image display mode, the present LCD panel may be operated in an illumination mode with much enhanced light intensity as compared to that in the image display mode. The LCD panel may be switched to the illumination mode manually by a user or automatically in response to a detected ambient light intensity below a threshold level. For example, the LCD panel may be switched to the illumination mode in response to a user-activated operation to turn on front illumination. Optionally, the LCD panel may be switched to the illumination mode in response to a user-activated operation to turn on a front camera. Optionally, the LCD panel may be switched to the illumination mode in response to a user-activated operation to turn on a front camera and front illumination.

In one aspect, the present disclosure provides a LCD panel having a plurality of pixels for image display, each of which includes a subpixel region and an inter-pixel region. In some embodiments, the LCD panel includes an array substrate, a package substrate facing the array substrate, and a liquid crystal layer between the array substrate and the package substrate. The LCD panel includes a layered structure between the array substrate and the package substrate. The layered structure includes a pixel electrode layer and a common electrode layer for applying an electric field for driving the liquid crystal layer; and a first electrode signal line layer having a plurality of first electrode signal lines. The pixel electrode layer includes a plurality of pixel electrodes, the common electrode layer includes a plurality of common electrodes. Optionally, at least a portion of the first electrode signal line electrically connected to the output terminal is in an inter-subpixel region of the liquid crystal display panel. Specifically, the present LCD panel further includes a plurality of circuits for enhancing light transmittance of the liquid crystal layer, each of the plurality of circuits including an output terminal electrically connected to a first electrode signal line of the first electrode signal line layer, an input terminal configured to receive an input voltage, and a control terminal configured to receive a control voltage. At least the portion of the first electrode signal line electrically connected to the output terminal in the inter-subpixel region of the liquid crystal display panel is configured to generate an additional electric field with at least one of the common electrode, the pixel electrode, a touch electrode, and another first electrode signal line when the control voltage is an ON voltage to allow the input voltage to be passed from the input terminal to the output terminal and in turn to the first electrode signal line connected to the output terminal. The additional electric field is applied to the liquid crystal layer for enhancing light transmittance of the liquid crystal layer (and in turn light transmittance of the liquid crystal display panel). The plurality of circuits are configured to be turned off when the control voltage is an OFF voltage.

As used herein, an inter-subpixel region refers to a region between adjacent subpixel regions, such as a region corresponding to a black matrix in a liquid crystal display. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

In some embodiments, each of the plurality of circuits includes a transistor having a drain electrode electrically connected to a first electrode signal line of the first electrode signal line layer, a source electrode configured to receive a source voltage, and a gate electrode configured to receive a gate voltage. The first electrode signal line electrically connected to the drain electrode is configured to generate an additional electric field with at least one of the common electrode, the pixel electrode, a touch electrode, and another first electrode signal line when the gate voltage is an ON voltage to allow the source voltage to be passed from the source electrode to the drain electrode and in turn to the first electrode signal line connected to the drain electrode. The additional electric field is applied to the liquid crystal layer for enhancing light transmittance of the liquid crystal layer (and in turn light transmittance of the liquid crystal display panel).

The first electrode signal line layer in the inter-subpixel region of the liquid crystal display panel may be any appropriate electrode signal line layer disposed in the inter-subpixel region. Examples of first electrode signal line layers includes a touch electrode layer in the inter-subpixel region, a shielding electrode layer in the inter-subpixel region (e.g., a shielding electrode layer in the black matrix region for preventing crosstalk between adjacent data line and common electrode), a dummy signal line layer in the inter-subpixel region (e.g., a repair line layer for repairing data line open circuit; see, e.g., the repair line layer described in Chinese Patent Application No. 201610086241.1, which is hereby incorporated herein by reference in its entirety), and a touch electrode signal line layer. The first electrode signal line may be a metal electrode line or a transparent conductive electrode line.

In some embodiments, the first electrode signal line layer is a touch electrode layer having a plurality of touch electrodes for detecting touch, and thus the LCD panel is a liquid crystal touch display panel Optionally, each of the plurality of circuits includes a transistor having a drain electrode electrically connected to a touch electrode of the touch electrode layer, a source electrode configured to receive a source voltage, and a gate electrode configured to receive a gate voltage. Optionally, at least a portion of the touch electrode electrically connected to the output terminal is in the inter-subpixel region of the liquid crystal display panel. In some embodiments, the portion of the touch electrode electrically connected to the drain electrode in the inter-subpixel region of the liquid crystal display panel is configured to generate an additional electric field with at least one of the common electrode, the pixel electrode, and another touch electrode when the gate voltage is an ON voltage to allow the source voltage to be passed from the source electrode to the drain electrode and in turn to the touch electrode connected to the drain electrode. The additional electric field is applied to the liquid crystal layer for enhancing light transmittance of the liquid crystal layer (and in turn light transmittance of the liquid crystal display panel). Specifically, when the gate voltage is an ON voltage, the transistor connected to the touch electrode is turned on, and the source voltage passes from the source electrode to the drain electrode, and in turn to the touch electrode connected thereto, i.e., the touch electrode connected to the drain electrode receives a source voltage. In some embodiments, the source voltage has a high voltage level. An additional electric field is formed between the touch electrode connected to the drain electrode and another electrode in the liquid crystal touch display panel having a low voltage level. For example, the additional electric field may be formed between the touch electrode connected to the drain electrode and the common electrode layer. Optionally, the touch electrode connected to the drain electrode is an electrode in a mutual capacitive touch electrode layer (e.g., one of a pair of touch sensing electrode and touch scanning electrode), and the additional electric field is formed between the pair of touch sensing electrode and touch scanning electrode.

The additional electric field is applied to the liquid crystal layer on top of an existing electric field generated between the pixel electrode layer and the common electrode layer. Upon the application of the additional electric field, the liquid crystal molecules in the liquid crystal layer are reoriented in a way that light transmittance through the liquid crystal layer may be enhanced.

When the gate voltage is an OFF voltage, the transistor connected to the touch electrode is turned off, i.e., the source voltage is not passed from the source electrode to the drain electrode, and the touch electrode connected to the drain electrode does not receive the source voltage.

In some embodiments, the transistor in the light transmittance enhancing circuit is a P-type thin film transistor. When the gate voltage is a low voltage level, the P-type thin film transistor is turned on, i.e., the ON voltage is a low voltage level. When the gate voltage is a high voltage level, the P-type thin film transistor is turned off, i.e., the OFF voltage is a high voltage level. In some embodiments, the transistor in the light transmittance enhancing circuit is an N-type thin film transistor. When the gate voltage is a high voltage level, the N-type thin film transistor is turned on, i.e., the ON voltage is a high voltage level. When the gate voltage is a low voltage level, the N-type thin film transistor is turned off, i.e., the OFF voltage is a low voltage level.

In some embodiments, the touch electrode layer is a self-capacitive type touch electrode layer. The self-capacitive type touch substrate has a construction in which a plurality of independent patterns are formed in the touch area. In the self-capacitive type touch panel, the touched positions are detected by measuring change of capacitances of the independent patterns. In some embodiments, the touch electrode layer is a mutual capacitive type touch electrode layer. The mutual capacitive type touch substrate has a matrix construction in which first electrode patterns (e.g., touch scanning electrodes) arranged in an x-axis direction cross over second electrode patterns (e.g., touch sensing electrodes) arranged in a y-axis direction. In the mutual capacitive type touch panel, the touched positions are detected by measuring changes of capacitances appeared to sensing nodes through the touch sensing electrodes alter supplying a scanning voltage to the touch scanning electrodes. The sensing nodes are cross points of the touch scanning and sensing electrodes.

In some embodiments, the touch electrode connected to the drain electrode of the transistor in the light transmittance enhancing circuit is a touch electrode in a self-capacitive type touch electrode layer. Optionally, the additional electric field is formed between the touch electrode connected to the drain electrode and the common electrode layer when the gate voltage is an ON voltage. Optionally, wherein the touch electrode layer is in a same layer as the common electrode layer.

In some embodiments, the touch electrode connected to the drain electrode of the transistor in the light transmittance enhancing circuit is a touch electrode in a mutual capacitive touch electrode layer having a plurality of first touch electrodes and a plurality of second touch electrodes, e.g., the touch electrode connected to the drain electrode is a first touch electrode in the mutual capacitive touch electrode layer. Optionally, the additional electric field is formed between a first touch electrode and the common electrode layer when the gate voltage is an ON voltage. Optionally, the additional electric field is formed between a fast touch electrode and an adjacent second touch electrode when the gate voltage is an ON voltage. Optionally, the additional electric field is formed both between the first touch electrode and the adjacent second touch electrode, and between the first touch electrode and the common electrode layer, when the gate voltage is an ON voltage. Optionally, the first touch electrode is a touch sensing electrode, e.g., a touch sensing electrode in an area corresponding to a black matrix layer of the liquid crystal touch display panel. Optionally, the first touch electrode is a touch scanning electrode, e.g., a touch scanning electrode in an area corresponding to a black matrix layer of the liquid crystal touch display panel.

In some embodiments, the common electrode layer includes a plurality of touch scanning electrodes operated in a time-division driving mode. Optionally, the time-division driving mode includes a display mode and a touch control mode. Optionally, the time-division driving mode includes a display mode, a touch control mode, and an illumination mode as discussed herein. Optionally, the plurality of touch scanning electrodes are common electrodes for applying common voltage signal during the display more. Optionally, the plurality of touch scanning electrodes are touch control electrodes for conducting touch signals during the touch control mode. Optionally, the plurality of touch scanning electrodes are electrodes for applying additional electric field to the liquid crystal layer for enhancing light transmittance of the liquid crystal layer with at least one of the common electrode, the pixel electrode, and another touch electrode.

In some embodiments, the plurality of first touch electrodes are a plurality of touch scanning electrodes, the plurality of second touch electrodes are a plurality of touch sensing electrodes, and the first touch electrodes and the plurality of second touch electrodes; are in different layers. In some embodiments, the plurality of first touch electrodes are a plurality of touch sensing electrodes, the plurality of second touch electrodes are a plurality of touch scanning electrodes, and the plurality of first touch electrodes and the plurality of second touch electrodes are in different layers.

In some embodiments, the additional electric field is formed between the touch electrode connected to the drain electrode and the common electrode layer when the gate voltage is an ON voltage. Optionally, the touch electrode layer is in a same layer as the common electrode layer.

Optionally, the touch display panel is an in-cell touch panel. Optionally, the touch display panel is an on-cell touch panel. Optionally, the touch display panel is an add-on type touch panel. Optionally, the add-on type touch display panel has touch electrodes embedded on a glass surface. Optionally, the add-on type touch display panel has touch electrodes embedded on a thin film. Optionally, the add-on type touch display panel is a one-glass-solution type touch display panel. In the one-glass-solution type touch panel, touch electrodes are integrated on a cover glass. Optionally, the add-on type touch display panel is a glass-film-film type touch panel.

Accordingly, the touch electrode layer may be disposed in various appropriate positions. In some embodiments, the touch electrode layer is in the array substrate. Optionally, the touch electrode layer is in a same layer as the common electrode layer.

In some embodiments, the touch electrode layer is in the package substrate. For example, the touch electrode layer may be disposed in an area that does not affect the aperture ratio of the liquid crystal touch display apparatus. Optionally, the package substrate includes a black matrix layer; and the touch electrode layer is on a side of the black matrix layer proximal to the array substrate. Optionally, the package substrate includes a passivation layer (e.g., on a side of the black matrix proximal to the array substrate); and the touch electrode layer is on a side of the passivation layer proximal to the array substrate.

In some embodiments, the touch electrode layer is in the package substrate, and the common electrode layer is in the array substrate. The additional electric field may be formed between the touch electrode connected to the drain electrode and the common electrode layer when the gate voltage is an ON voltage. In some embodiments, both the touch electrode layer and the common electrode layer is in the array substrate.

The gate voltage may be controlled by a controller in the liquid crystal touch display apparatus. For example, the controller may be configured to switch the gate voltage between an ON voltage and an OFF voltage. In some embodiments, the controller is configured to receive a control signal. Upon receiving the control signal, the controller sets the gate voltage to a certain level. Optionally, the control signal is an ON signal, the controller sets the gate voltage to be an ON voltage upon receiving the ON signal. Optionally, the control signal is an OFF signal, the controller sets the gate voltage to be an OFF voltage upon receiving the OFF signal.

Accordingly, the present disclosure in another aspect provides a method of controlling a liquid crystal display panel described hereinthroughout. The liquid crystal display panel includes a plurality of pixels for image display, each of which includes a subpixel region and an inter-subpixel region. In some embodiments, the LCD panel includes an array substrate, a package substrate facing the array substrate, and a liquid crystal layer between the array substrate and the package substrate; a pixel electrode layer and a common electrode layer for applying an electric field for driving the liquid crystal layer, the pixel electrode layer including a plurality of pixel electrodes, the common electrode layer including a plurality of common electrodes; a first electrode signal line layer having a plurality of first electrode signal lines; a plurality of circuits for enhancing light transmittance of the liquid crystal layer, each of the plurality of circuits having an output terminal electrically connected to a first electrode signal line of the first electrode signal line layer, an input terminal configured to receive an input voltage, and a control terminal configured to receive a control voltage, at least a portion of the first electrode signal line electrically connected to the output terminal is in the inter-subpixel region of the liquid crystal display panel; and a controller configured to set the gate voltage to be a turn-on voltage upon receiving a control signal, i.e., for controlling the control voltage between an ON voltage and an OFF voltage. The portion of the first electrode signal line electrically connected to the output terminal in the inter-subpixel region of the liquid crystal display panel is configured to generate an additional electric field with at least one of the common electrode, the pixel electrode, a touch electrode, and another first electrode signal line when the control voltage is the ON voltage to allow the input voltage to be passed from the input terminal to the output terminal and in turn to the first electrode signal line connected to the output terminal. The additional electric field is applied to the liquid crystal layer for enhancing light transmittance of the liquid crystal layer. The plurality of circuits are configured to be turned off when the control voltage is the OFF voltage. In some embodiments, the method includes transmitting a control signal to the controller; setting the control voltage to be the ON voltage by the controller upon receiving the control signal, thereby allowing the input voltage to be passed from the input terminal to the output terminal and in turn to the first electrode signal line connected to the output terminal; applying the additional electric field generated by the first electrode signal line connected to the output terminal to the liquid crystal layer; and reorienting liquid crystal molecules in the liquid crystal layer to enhance light transmittance of the liquid crystal layer.

In some embodiments, the LCD panel includes an array substrate, a package substrate facing the array substrate, and a liquid crystal layer between the array substrate and the package substrate; a pixel electrode layer and a common electrode layer for applying an electric field for driving the liquid crystal layer; a touch electrode layer having a plurality of touch electrodes for detecting touch; and a plurality of circuits, each of the plurality of circuits including a transistor having a drain electrode electrically connected to a touch electrode of the touch electrode layer, a source electrode configured to receive a source voltage, and a gate electrode configured to receive a gate voltage. Optionally, at least a portion of the touch electrode electrically connected to the output terminal is in the inter-subpixel region of the liquid crystal display panel. The portion of the touch electrode electrically connected to the drain electrode in the inter-subpixel region of the liquid crystal display panel is configured to generate an additional electric field with at least one of the common electrode, the pixel electrode, and another touch electrode when the gate voltage is an ON voltage to allow the source voltage to be passed from the source electrode to the drain electrode and in turn to the touch electrode connected to the drain electrode, and the transistor is configured to be turned off when the gate voltage is an OFF voltage. The additional electric field is applied to the liquid crystal layer for enhancing light transmittance of the liquid crystal layer. In some embodiments, the method includes transmitting a control signal to the controller; setting the gate voltage to be the ON voltage by the controller upon receiving the control signal, thereby allowing the source voltage to be passed from the source electrode to the drain electrode and in turn to the touch electrode connected to the drain electrode; generating the additional electric field by the touch electrode connected to the drain electrode; generating an additional electric field between the portion of the first electrode signal line in the inter-subpixel region of the liquid crystal display panel and at least one of the common electrode, the pixel electrode, a touch electrode, and another first electrode signal line; and applying the additional electric field to the liquid crystal layer. Optionally, the method further includes reorienting liquid crystal molecules in the liquid crystal layer to enhance light transmittance of the liquid crystal layer.

The controller may be subject to manual control or automatic control. In some embodiments, the controller is subject to manual control. For example, the control signal (e.g., the ON signal) is generated in response to a user operation. Optionally, the user operation is an operation of turning on a front camera. Optionally, the user operation is an operation of turning on front illumination (e.g., the illumination mode of the display apparatus described hereinthroughout). Optionally, the user operation is an operation of turning on a front camera and front illumination.

In some embodiments, the controller is subject to automatic control. For example, the control signal (e.g., the ON signal) is generated by a light sensor in response to an ambient light intensity equal to or higher than a threshold value. The light sensor transmits a control signal (e.g., the ON signal) to the controller. Upon receiving the ON signal, the controller sets the gate voltage to be an ON voltage, allowing the source voltage to be passed from the source electrode to the drain electrode, and in turn to the touch electrode connected to the drain electrode. The additional electric field is generated by the touch electrode connected to the drain electrode, and the light transmittance of the liquid crystal layer is enhanced by the additional electric field.

Accordingly, the present disclosure in another aspect provides a method of controlling a liquid crystal touch display apparatus described hereinthroughout. In some embodiments, the method includes transmitting a control signal to the controller; setting the gate voltage to be the ON voltage by the controller upon receiving the control signal, thereby allowing the source voltage to be passed from the source electrode to the drain electrode and in turn to the touch electrode connected to the drain electrode generating the additional electric field by the touch electrode connected to the drain electrode; applying the additional electric field generated by the touch electrode connected to the drain electrode to the liquid crystal layer; and reorienting liquid crystal molecules in the liquid crystal layer to enhance light transmittance of the liquid crystal layer.

FIG. 1 is diagram illustrating the structure of a liquid crystal touch display apparatus according to some embodiments. Referring to FIG. 1, the liquid crystal touch display apparatus 100 includes a display panel having a liquid crystal layer 8 sandwiched between an array substrate 101 and a package substrate 102; and a backlight module 9 attached to a side of the array substrate 101 distal to the package substrate 102. The array substrate 101 includes a plurality of signal lines 7 (e.g., gate lines, data lines, etc.) for driving image display; a plurality of pixel electrodes 4; a plurality of common electrodes 6; and a plurality of touch electrodes 5 (e.g., touch sensing electrodes Rx or touch scanning electrodes Tx). The plurality of pixel electrode 4 and the plurality of common electrode 6 are spaced apart by a first passivation layer 3a. The package substrate 102 includes a black matrix 1, a color filter 2, and a second passivation layer 3b. The liquid crystal touch display apparatus 100 further includes a light transmittance enhancing circuit (see FIG. 2) connected to a touch electrode 5. As shown in FIG. 1, a pixel electrode 4 and a common electrode 6 are configured to generate an electric field 10; and a touch electrode 5 and a common electrode 6 are configured to generate an additional electric field 10'. The application of the additional electric field 10' reorients liquid crystal molecules in the liquid crystal layer 8, enhancing light transmittance of the liquid crystal layer 8.

Figure 2:
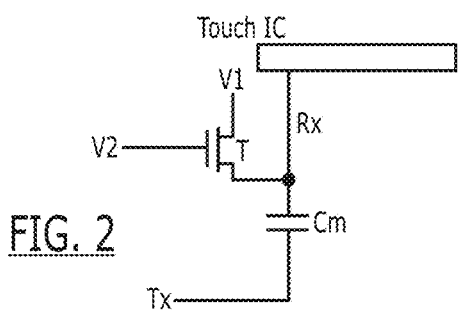
FIG. 2 illustrates a light transmittance enhancing circuit in some embodiments.

FIG. 2 illustrates a light transmittance enhancing circuit in some embodiments. Referring to FIG. 2, the light transmittance enhancing circuit includes a transistor T coupled to a touch electrode Rx, which is in turn connected to a touch-control integrated circuit, Touch IC. The light transmittance enhancing circuit of the FIG. 2 uses the transistor T as a switch to apply a voltage signal to the touch electrode. When the voltage signal is not applied to the touch electrode, the liquid crystal touch display apparatus 100 is in a normal image display mode. When the voltage signal is applied to the touch electrode, the liquid crystal touch display apparatus 100 is operated in an illumination mode.

Referring to FIG. 2, in a specific embodiment, the light transmittance enhancing circuit includes a transistor T having its drain node coupled to a Rx touch electrode. The Rx touch electrode forms a capacitor Cm with a Tx touch electrode. The transistor T has a source node configured to receive a first voltage signal V1 and a gate node configured to receive a second voltage signal V2. Both voltage signals V1 and V2 can be provided by one or more control circuit (not shown). In some embodiments, the first voltage signal V1 is set to a high voltage level (e.g., as compared to a fixed common electrode voltage), which may be preset or tunable based on specific applications. The second voltage signal V2 is a control signal for the transistor T. Optionally, V1 is in the range of approximately 3 V to approximately 10 V.

In some embodiments, the light transmittance enhancing circuit is configured to turn the transistor T off (e.g., in a non-conduction state) so that no voltage is passed from the source node to the Rx touch electrode to induce any additional electric field to the liquid crystal layer, when the liquid crystal touch display apparatus is operated in the normal image display mode. The electric field applied to the liquid crystal layer during the normal image display mode is a first electric field generated between a plurality of pixel electrodes and the common electrode. When the transistor T is an N-type transistor, the second voltage signal V2 may be set to a system low level sufficient to turn the transistor off during a normal image display mode. When the transistor T is a P-type transistor, the second voltage signal V2 may be set to a system high level sufficient to turn the transistor T off during the normal image display mode.

When the liquid crystal touch display apparatus 100 is switched (e.g., by activation) to an illumination mode, the light transmittance enhancing circuit is configured to provide a second voltage signal V2 to turn on the transistor T, allowing the first voltage signal V1 to pass from the source node to the Rx touch electrode connected to the drain node. When the transistor T is an N-type transistor, the second voltage signal V2 may be set to a system high level sufficient to turn the transistor T on during the illumination mode. When the transistor is a P-type transistor, the second voltage signal V2 may be set to a system low level sufficient to turn the transistor T on during the illumination mode. In the illumination mode, the liquid crystal touch display apparatus uses light transmitted from the backlight module to the frontside of the display panel for enhanced illumination. When the first voltage signal V1 (e.g., at a high potential level) is applied to the touch electrode, an additional electric field is induced at least by a voltage difference between the touch electrode and the common electrode, or a voltage difference between the Rx touch electrode and the Tx touch electrode, or a combination thereof. The additional electric field is applied to the liquid crystal layer in combination with the electric field generated between the pixel electrode layer and the common electrode layer, resulting in a modification of the electric field 10 in the liquid crystal layer (see, e.g., FIG. 1). The modified electric field 10 re-orients liquid crystal molecules in the liquid crystal layer, effectively enhancing transmittance of light through the liquid crystal layer from the backlight module. Higher illumination brightness at the frontside of the display panel may be achieved.

In FIG. 2, the drain node of the transistor T in the light transmittance enhancing circuit is electrically connected to a Rx touch electrode. In some embodiments, the drain node of the transistor T in the light transmittance enhancing circuit is electrically connected to a Tx touch electrode. For example, when the liquid crystal touch display apparatus 100 is switched (e.g., by activation) to an illumination mode, the light transmittance enhancing circuit is configured to provide a second voltage signal V2 to turn on the transistor T, allowing the first voltage signal V1 to pass from the source node to the Tx touch electrode connected to the drain node. When the transistor T is an N-type transistor, the second voltage signal V2 may be set to a system high level sufficient to turn the transistor T on during the illumination mode. When the transistor T is a P-type transistor, the second voltage signal V2 may be set to a system low level sufficient to turn the transistor T on during the illumination mode.

Figure 3:
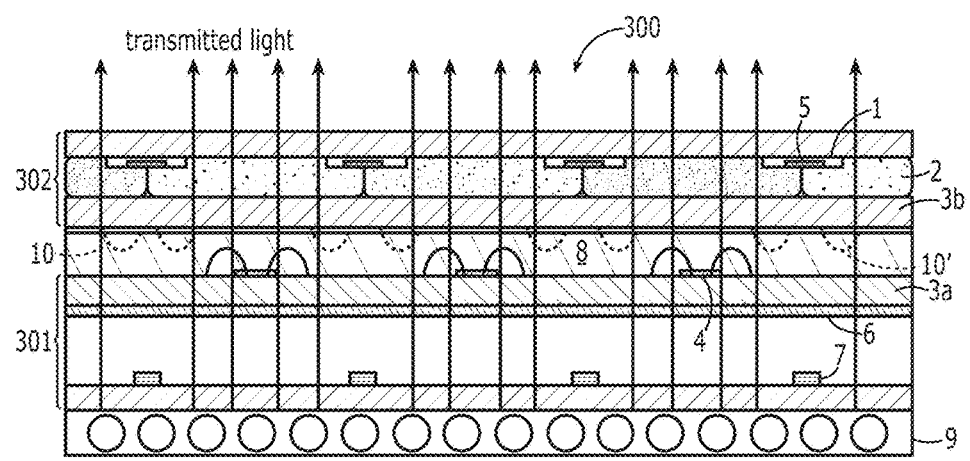
FIG. 3 is diagram illustrating the structure of a liquid crystal touch display apparatus according to some embodiments.

Various appropriate liquid crystal touch display apparatuses may be used. FIG. 3 is diagram illustrating the structure of a liquid crystal touch display apparatus according to some embodiments. Referring to FIG. 3, the liquid crystal touch display apparatus 300 includes a display panel having a liquid crystal layer 8 sandwiched between an array substrate 301 and a package substrate 302; and a backlight module 9 attached to a side of the array substrate 301 distal to the package substrate 303. The array substrate 301 includes a plurality of signal lines 7 (e.g., gate lines, data lines, etc.) for driving image display; a plurality of pixel electrodes 4; a plurality of common electrodes 6; and a plurality of touch electrodes 5 (e.g., touch sensing electrodes Rx or touch scanning electrodes Tx). The plurality of pixel electrode 4 and the plurality of common electrode 6 are spaced apart by a first passivation layer 3a. The package substrate 302 includes a black matrix 1, a color filter 2, and a second passivation layer 3b. The liquid crystal touch display apparatus 300 further includes a light transmittance enhancing circuit (see FIG. 2) connected to a touch electrode 5.

The plurality of touch electrodes 5 in FIG. 3 is disposed in the package substrate 302, e.g., the touch electrode 3 is on a side of the black matrix 1 proximal to the array substrate 301. Optionally, the touch electrode 5 is on a side of the second passivation layer 3b distal to the array substrate 301. As shown in FIG. 3, a pixel electrode 4 and a common electrode 6 are configured to generate an electric field 10; and touch electrodes are configured to generate an additional electric field 10'. Optionally, the additional electric field 10' is generated between a touch sensing electrode Rx and an adjacent touch scanning electrode Tx (one of which is shown as touch electrode 5 in FIG. 3). Optionally, the additional electric field 10' is generated between a touch electrode 5 and a common electrode 6 (not shown in FIG. 3). The application of the additional electric field 10' reorients liquid crystal molecules in the liquid crystal layer 8, enhancing light transmittance of the liquid crystal layer 8.

Figure 4:
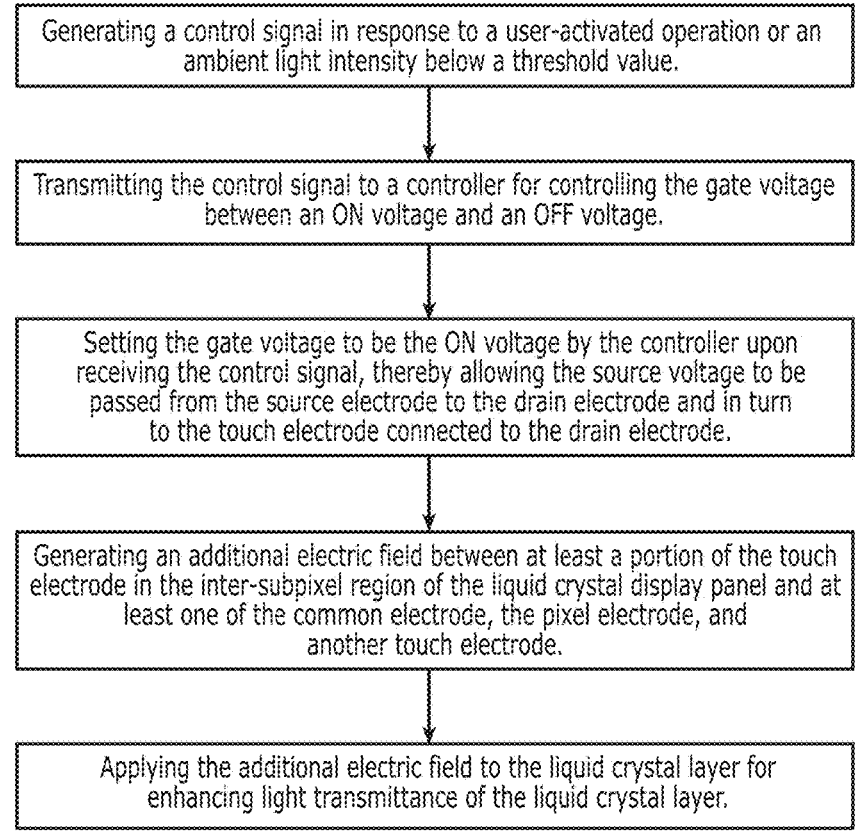
FIG. 4 is a flow chart illustrating a method for controlling backlight illumination of a liquid crystal touch display apparatus according to some embodiments.

FIG. 4 is a flow chart illustrating a method for controlling backlight illumination of a liquid crystal touch display apparatus according to some embodiments. In some embodiments, the liquid crystal touch display apparatus includes an array substrate, a package substrate facing the array substrate, a liquid crystal layer between the array substrate and the package substrate; a pixel electrode layer and a common electrode layer for applying an electric field for driving the liquid crystal layer; a touch electrode layer having a plurality of touch electrodes for detecting touch; a plurality of circuits, each of the plurality of circuits including a transistor having, a drain electrode electrically connected to a touch electrode of the touch electrode layer a source electrode configured to receive a source voltage, and a gate electrode configured to receive a gate voltage; and a controller for controlling the gate voltage between an ON voltage and an OFF voltage. The touch electrode electrically connected to the drain electrode is configured to apply an additional electric field to the liquid crystal layer for enhancing light transmittance of the liquid crystal layer when the gate voltage is the ON voltage to allow the source voltage to be passed from the source electrode to the drain electrode and in turn to the touch electrode connected to the drain electrode. The transistor is configured to be turned off when the gate voltage is the OFF voltage.

Referring to FIG. 4, the method in the embodiment includes generating a control signal in response to a user-activated operation or an ambient light intensity below a threshold value; transmitting the control signal to a controller for controlling the gate voltage between an ON voltage and an OFF voltage; setting the gate voltage to be the ON voltage by the controller upon receiving the control signal, thereby allowing the source voltage to be passed from the source electrode to the drain electrode and in turn to the touch electrode connected to the drain electrode; generating an additional electric field between at least a portion of the touch electrode in the inter-subpixel region of the liquid crystal display panel and at least one of the common electrode, the pixel electrode, and another touch electrode; and applying the additional electric field to the liquid crystal layer fin enhancing light transmittance of the liquid crystal layer. Optionally, the method further includes reorienting liquid crystal molecules in the liquid crystal layer to enhance light transmittance of the liquid crystal layer.

Figure 5:
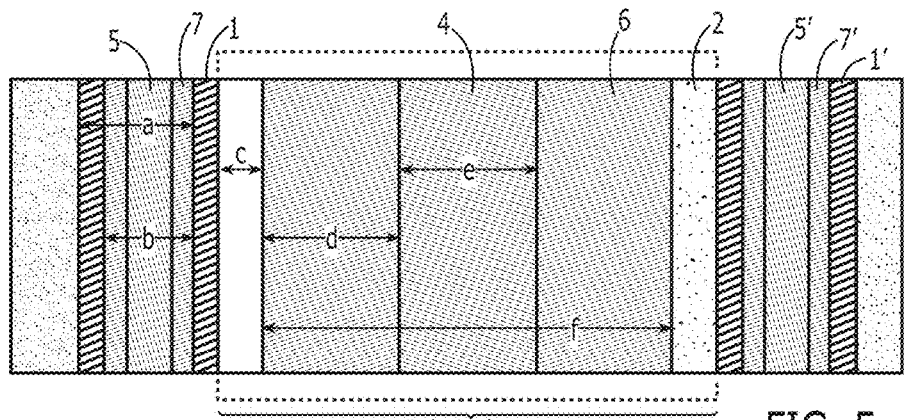
FIG. 5 shows a subpixel structure used in a simulation for controlling transmittance of a liquid crystal layer associated with a liquid crystal touch display apparatus according to some embodiments.

FIG. 5 shows a subpixel structure used in a simulation for controlling transmittance of a liquid crystal layer associated with a liquid crystal touch display apparatus according to some embodiments. For example, a simulation may be performed based on the exemplary subpixel design to evaluate light transmittance through the liquid crystal layer, e.g., light transmittance when the touch electrode connected to the drain electrode receives no voltage and light transmittance when the touch electrode connected to the drain electrode receives the first voltage signal V1. Specifically, a TECHWIZ simulation may be performed on a subpixel having a 17.2 μm cross-sectional width. Referring to FIG. 5, the subpixel unit is disposed in a region between two neighboring black matrix regions 1 and 1'. Each of the black matrix regions 1 and 1' has a width a of 4 μm. The signal lines 7 and 7' and the touch electrodes 5 and 5' (e.g., a Rx touch electrode) are disposed in the black matrix regions 1 and 1'. As shown in FIG. 5, each of the signal lines 7 and 7' has a width b of 3 μm. In plan view of the subpixel, a common electrode 6 is disposed between two neighboring black matrix regions 1 and 1'. The projection of the common electrode 6 in plan view of the subpixel is spaced apart from that of the black matrix regions 1 and 1' by a gap distance c of 1.1 μm. The width f of the common electrode 6 in plan view of the subpixel is set to 11 μm. A projection of a pixel electrode 4 overlaps with that of the common electrode 6 in plan view of the subpixel. The pixel electrode 4 has a width e of 3 μm in plan view of the subpixel. The projection of the common electrode 6 in plan view of the subpixel is wider than that of the pixel electrode 4 by a distance d of 4 μm on both sides.

Figure 6A:
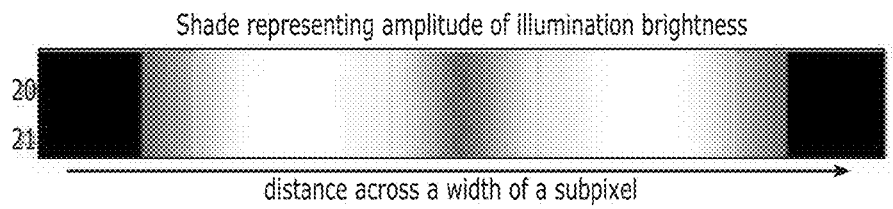
FIG. 6 shows simulation results based on a subpixel unit design of FIG. 5 when a touch electrode connected to the drain electrode receives no voltage in some embodiments: (A) illumination brightness; (B) light transmittance; and (C) electric field distribution in a subpixel unit of the liquid crystal touch display apparatus.
Figure 6B:
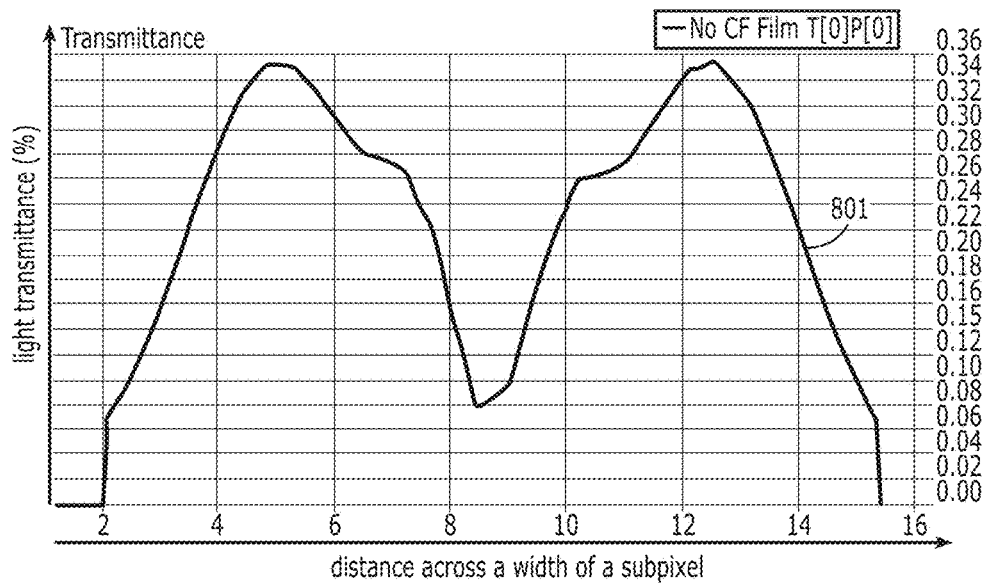
Figure 6C:
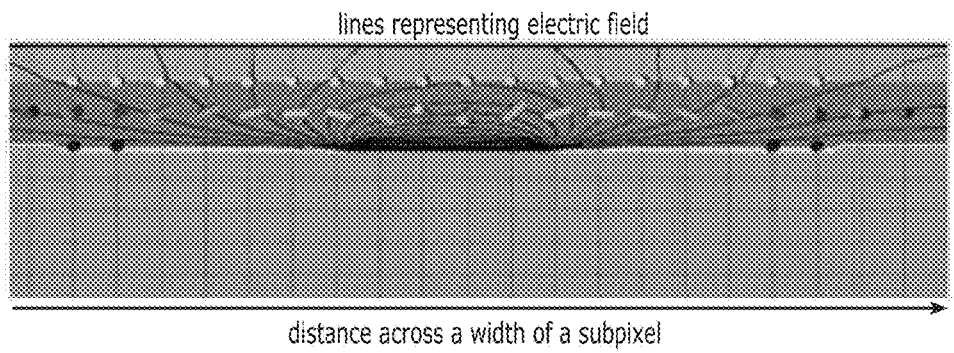

FIG. 6 shows simulation results based on a subpixel unit design of FIG. 5 when a touch electrode connected to the drain electrode receives no voltage in some embodiments: (A) illumination brightness; (B) light transmittance; and (C) electric field distribution in a subpixel unit of the liquid crystal touch display apparatus. In this example, the first voltage signal V1 is set to a high voltage level, e.g., 5 V, the second voltage signal V2 is an OFF voltage (e.g., a system low voltage level sufficient to turn an N-type transistor in the light transmittance enhancing circuit off). The touch electrode connected to the drain electrode of the transistor does not receive the first voltage signal V1. (A) in FIG. 6 shows a map of illumination brightness across the width of a subpixel unit. (B) in FIG. 6 shows a plot of light transmittance 801 across the width of the subpixel unit. On average, the light transmittance is 4.5% and the brightness is 450 nit.

Figure 7A:
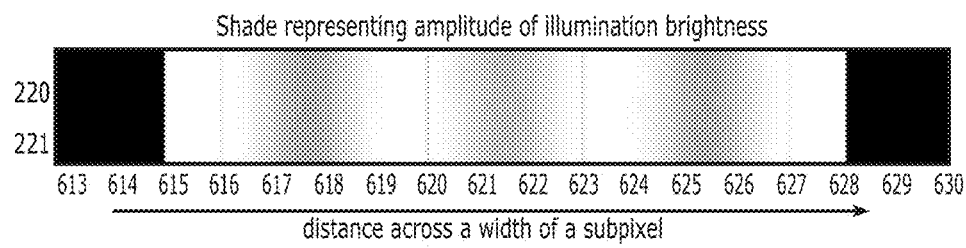
FIG. 7 shows simulation results based on a subpixel unit design of FIG. 5 when a touch electrode connected to the drain electrode receives a first voltage signal V1 in some embodiments: (A) illumination brightness; (B) light transmittance; and (C) electric field distribution in a subpixel unit of the liquid crystal touch display apparatus.
Figure 7B:
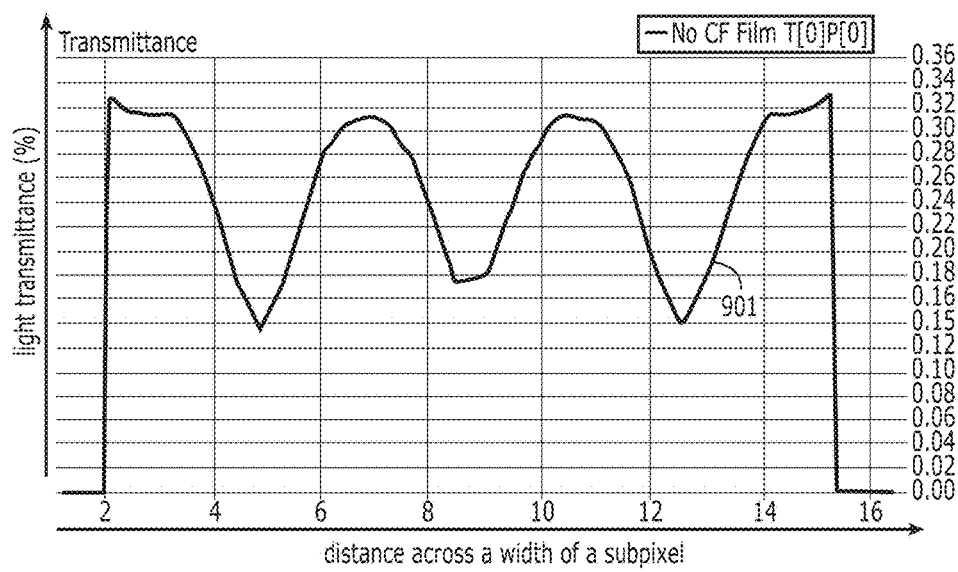
Figure 7C:
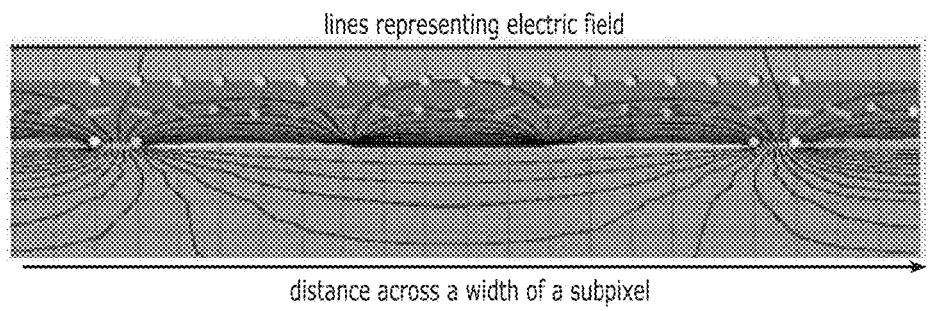

FIG. 7 shows simulation results based on a subpixel unit design of FIG. 5 when a touch electrode connected to the drain electrode receives a first voltage signal V1 in some embodiments: (A) illumination brightness; (B) light transmittance; and (C) electric field distribution in a subpixel unit of the liquid crystal touch display apparatus. In this example, the first voltage signal V1 is set to a high voltage level, e.g., 5 V, the second voltage signal V2 is an ON voltage (e.g., a system high voltage level sufficient to turn an N-type transistor in the light transmittance enhancing circuit on). The first voltage signal V1 is passed from the source electrode to the drain electrode, and the touch electrode connected to the drain electrode of the transistor receives the first voltage signal V1. As shown in (C) FIG. 7, an additional electric field is generated by the touch electrode connected to the drain electrode. (A) in FIG. 7 shows a map of illumination brightness across the width of a subpixel unit. (B) in FIG. 7 shows a plot of light transmittance 901 across the width of the subpixel unit. As shown in (A) in FIG. 7 and (B) in FIG. 7, the additional electric field enhances light transmittance through the liquid crystal layer. On average, the light transmittance is 5.5% and the brightness is 550 nit (a 22% increase as compared to that of (A) in FIG. 6).

In another aspect, the present disclosure provides a LCD apparatus having the LCD panel described herein. Various appropriate LCD apparatuses may be used. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A liquid crystal display panel having a plurality of pixels for image display, each of which includes a subpixel region and an inter-subpixel region, comprising:
    an array substrate, a package substrate facing the array substrate, and a liquid crystal layer between the array substrate and the package substrate;
    a pixel electrode layer and a common electrode layer for applying an electric field for driving the liquid crystal layer, the pixel electrode layer comprising a plurality of pixel electrodes, the common electrode layer comprising a plurality of common electrodes;
    a first electrode signal line layer comprising a plurality of first electrode signal lines; and
    a plurality of circuits, each of the plurality of circuits comprising an output terminal electrically connected to one of the plurality of first electrode signal lines of the first electrode signal line layer, an input terminal configured to receive an input voltage, and a control terminal configured to receive a control voltage; at least a portion of the one of the plurality of first electrode signal lines electrically connected to the output terminal is in the inter-subpixel region of the liquid crystal display panel;
    wherein the portion of the one of the plurality of first electrode signal lines in the inter-subpixel region of the liquid crystal display panel is configured to generate an additional electric field with at least one of the plurality of common electrodes, the pixel electrode, a touch electrode, and another first electrode signal line of the plurality of first electrode signal lines; the additional electric field is applied to the liquid crystal layer for enhancing light transmittance of the liquid crystal layer;
    the first electrode signal line layer is a touch electrode layer comprising a plurality of touch electrodes for detecting touch;
    each of the plurality of circuits comprises a transistor having a drain electrode electrically connected to one of the plurality of touch electrodes of the touch electrode layer, a source electrode configured to receive a source voltage, and a gate electrode configured to receive a gate voltage; at least a portion of the one of the plurality of touch electrodes electrically connected to the output terminal is in the inter-subpixel region of the liquid crystal display panel; and
    the portion of the one of the plurality of touch electrodes in the inter-subpixel region of the liquid crystal display panel is configured to generate the additional electric field with at least one of the plurality of common electrodes, the pixel electrode, and another touch electrode of the plurality of touch electrodes for enhancing light transmittance of the liquid crystal layer.

2. The liquid crystal display panel of claim 1, wherein the touch electrode layer is a mutual capacitive touch electrode layer comprising a plurality of first touch electrodes and a plurality of second touch electrodes, and the one of the plurality of touch electrodes electrically connected to the drain electrode is one of the plurality of first touch electrodes.

3. The liquid crystal display panel of claim 2, wherein the plurality of first touch electrodes are a plurality of touch sensing electrodes.

4. The liquid crystal display panel of claim 2, wherein the plurality of first touch electrodes are a plurality of touch scanning electrodes.

5. The liquid crystal display panel of claim 4, wherein the common electrode layer comprises a plurality of touch scanning electrodes operated in a time-division driving mode; the time-division driving mode comprises a display mode and a touch control mode; the plurality of touch scanning electrodes are common electrodes for applying common voltage signal during the display mode; and the plurality of touch scanning electrodes are touch control electrodes for conducting touch signals during the touch control mode.

6. The liquid crystal display panel of claim 5, wherein the plurality of second touch electrodes are a plurality of touch sensing electrodes, and the plurality of first touch electrodes and the plurality of second touch electrodes are in different layers.

7. The liquid crystal display panel of claim 2, wherein the additional electric field is formed between the one of the plurality of first touch electrodes and an adjacent second touch electrode of the plurality of second touch electrodes.

8. The liquid crystal display panel of claim 2, wherein the additional electric field is generated between the one of the plurality of first touch electrodes and the one of the plurality of common electrodes.

9. The liquid crystal display panel of claim 1, wherein the touch electrode layer is a self-capacitive touch electrode layer.

10. The liquid crystal display panel of claim 1, wherein the touch electrode layer is in the package substrate.

11. The liquid crystal display panel of claim 10, wherein the package substrate comprises a black matrix layer; and the touch electrode layer is on a side of the black matrix layer proximal to the array substrate.

12. The liquid crystal display panel of claim 10, wherein the package substrate comprises a passivation layer; and the touch electrode layer is on a side of the passivation layer distal to the array substrate.

13. The liquid crystal display panel of claim 10, wherein the additional electric field is formed between the touch electrode connected to the drain electrode and the common electrode layer, and the common electrode layer is in the array substrate.

14. The liquid crystal display panel of claim 1, further comprising a controller configured to set the gate voltage to be a turn-on voltage upon receiving a control signal.

15. The liquid crystal display panel of claim 14, wherein the control signal is generated in response to a user-activated operation.

16. The liquid crystal display panel of claim 14, further comprising a light sensor configured to detect an ambient light intensity; wherein the light sensor is configured to transmit the control signal to the controller in response to an ambient light intensity below a threshold value.

17. A liquid crystal display apparatus, comprising a liquid crystal display panel of claim 1.

18. A method of controlling a liquid crystal display panel having a plurality of pixels for image display, each of which includes a subpixel region and an inter-subpixel region; the liquid crystal display panel comprising:
an array substrate, a package substrate facing the array substrate, and a liquid crystal layer between the array substrate and the package substrate; a pixel electrode layer and a common electrode layer for applying an electric field for driving the liquid crystal layer, the pixel electrode layer comprising a plurality of pixel electrodes, the common electrode layer comprising a plurality of common electrodes; a first electrode signal line layer comprising a plurality of first electrode signal lines; a plurality of circuits, each of the plurality of circuits comprising an output terminal electrically connected to one of the plurality of first electrode signal lines of the first electrode signal line layer, an input terminal configured to receive an input voltage, and a control terminal configured to receive a control voltage, at least a portion of the one of the plurality of first electrode signal lines electrically connected to the output terminal is in the inter-subpixel region of the liquid crystal display panel; and a controller configured to set a gate voltage to be a turn-on voltage upon receiving a control signal;

the method comprising:

transmitting a control signal to the controller;

setting the gate voltage to be the turn-on voltage by the controller upon receiving the control signal, thereby allowing the input voltage to be passed from the input terminal to the output terminal and in turn to the one of the plurality of first electrode signal lines connected to the output terminal;

generating an additional electric field between the portion of the one of the plurality of first electrode signal lines in the inter-subpixel region of the liquid crystal display panel and at least one of the plurality of common electrodes, the pixel electrode, a touch electrode, and another first electrode signal line of the plurality of first electrode signal lines; and applying the additional electric field to the liquid crystal layer.

19. The method of claim 18, further comprising generating the control signal in response to a user-activated operation.

20. The method of claim 18, wherein the liquid crystal display panel further comprises a light sensor configured to detect an ambient light intensity; and the method further comprising generating the control signal by the light sensor in response to an ambient light intensity below a threshold value.

* * * * *